(12) United States Patent
Evans et al.

(10) Patent No.: US 7,113,526 B2
(45) Date of Patent: Sep. 26, 2006

(54) MULTI-WAVELENGTH GRATING-OUTCOUPLED SURFACE EMITTING LASER SYSTEM

(75) Inventors: Gary A. Evans, Plano, TX (US); Dubravko Babic, San Jose, CA (US)

(73) Assignee: Photodigm, Inc., Richardson, TX (US)

( * ) Notice: Subject to any disclaimer, the term of this patent is extended or adjusted under 35 U.S.C. 154(b) by 299 days.

(21) Appl. No.: 10/682,334

(22) Filed: Oct. 9, 2003

(65) Prior Publication Data
US 2005/0078727 A1 Apr. 14, 2005

(51) Int. Cl.
- H01S 3/10 (2006.01)
- H01S 5/00 (2006.01)
- H01S 3/08 (2006.01)
- H01S 3/082 (2006.01)

(52) U.S. Cl. .............. 372/23; 372/50.11; 372/96; 372/97; 372/102

(58) Field of Classification Search .............. 372/23, 372/50.11, 96, 97, 102
See application file for complete search history.

(56) References Cited

U.S. PATENT DOCUMENTS

| | | | |
|---|---|---|---|
| 4,006,432 A | 2/1977 | Streifer et al. | 331/94.5 C |
| 4,511,408 A | 4/1985 | Holonyak, Jr. | 148/1.5 |
| 4,591,889 A | 5/1986 | Gossard et al. | 357/4 |
| 4,919,507 A | 4/1990 | Evans et al. | 350/96.19 |
| 4,958,357 A | 9/1990 | Kinoshita | 372/96 |
| 5,673,284 A | 9/1997 | Congdon et al. | 372/50 |
| 5,757,833 A | 5/1998 | Arakawa et al. | 372/45 |
| 5,970,081 A | 10/1999 | Hirayama et al. | 372/96 |
| 6,064,783 A | 5/2000 | Congdon et al. | 385/15 |
| 6,489,041 B1 | 12/2002 | Tamura et al. | 428/620 |
| 6,507,042 B1 | 1/2003 | Mukai et al. | 257/14 |
| 6,728,290 B1 * | 4/2004 | Coleman et al. | 372/102 |
| 6,775,427 B1 * | 8/2004 | Evans | 385/14 |
| 2002/0126942 A1 * | 9/2002 | Evans | 385/14 |

OTHER PUBLICATIONS

Encylopedia of Laser Physics and Technology □□http://www.rp-photonics.com/cavities.html.*

"Facetless Bragg Reflector Surface-Emitting AlGaAs/GaAs Lasers Fabricated by Electron-Beam Lithography and Chemically Assisted Ion-Beam Etching", Tiberio, R.C., et al., J.Vac.Sci. Technol. B9 (6), Nov./Dec. 1991.

"Laser Diode End Fire Coupling into Ti:LiNbO$_3$ Waveguides", Burns, Appl, Optics, 2536-2537, Aug. 1979.

"Research Toward Optical Fiber Transmission Systems Part 1, Miller et al.,"Proc. IEEE, 61, 1703-1751, Dec. 1973.

"Optimized Couplers Between Junction Lasers and Single Mode Fibers", Hammer, Neil, RCA Laboratories, Princeton, NJ, Final Report, Aug. 31, 1981-Jan. 31, 1983.

"Observations and Theory of High Power Butt Coupling to LiNbO$^3$-type Waaveguides", Hammer and Neil, IEEE J. Quantum Electronics, QE-18, 1751-1758, Oct. 1982.

"Bow-Tie Surface Emitting Lasers", Bedford, R., Luo, H., Fallahi, M., IEEE Photonics Tech. Let., vol. 12, No. 8, Aug. 2000.

(Continued)

Primary Examiner—Minsun Harvey
Assistant Examiner—Marcia A. Golub
(74) Attorney, Agent, or Firm—Duke W. Yee; Theodore D. Fay, III

(57) ABSTRACT

A surface emitting semiconductor laser system having four cavities that couple light from a single aperture. Each of the four cavities overlaps at the outcoupling aperture. Each cavity is fabricated to resonate at a different central wavelength, outputting a different frequency of light, each of which can be independently modulated.

5 Claims, 5 Drawing Sheets

OTHER PUBLICATIONS

"Surface-Emitting Distributed Feedback Quantum-Cascade Lasers", Schrenk, W. et al., Applied Physics Letters, vol. 77, No. 14, Oct. 2, 2000.

"Analysis of Grating Surface Emitting Lasers", Noll, R.J., Macomber, S.H., IEEE Journal of Quantum Electronics, vol. 26, No. 3, Mar. 1990.

Stoll, "Distributed Bragg Deflector: A Multifunctional Integrated Optical Device", Applied Optics, vol. 17, No. 16, Aug. 15, 1978, pp. 2562-2569.

Evans et al., "Progress Toward a Monolithically Integrated Coherent Diode Laser Array", The Aerospace Corp., El Segundo, CA 90245, Interim Report, Feb. 20, 1981, 204 pages.

* cited by examiner

MULTI-WAVELENGTH GRATING-OUTCOUPLED SURFACE EMITTING LASER SYSTEM

BACKGROUND OF THE INVENTION

1. Technical Field

The present invention relates generally to semiconductor laser systems, and particularly to surface emitting laser systems that couple a plurality of wavelengths of light from a single outcoupling aperture.

2. Description of Related Art

Transmission of light through waveguides has been pursued for many types of communications applications. Light signals offer many potential advantages over electronic signals. Light sources are commonly created from semiconductor devices, and include semiconductor devices such as LEDs (Light Emitting Diodes) and LDs (Laser Diodes).

Optical fiber is the most commonly used transmission medium for light signals. A single fiber is capable of carrying several different modulated signals within it at one time. For instance, wavelength division multiplexing divides the used bandwidth of the fiber into different channels (each channel containing a small range of wavelengths) and thus transmits several different wavelengths (or signals) of light at once. Using such a system requires sources for the different wavelengths. More wavelengths on the fiber require more sources to be coupled to the fiber.

Efficient coupling of light into a fiber is simplified if the laser beam has a cross sectional profile that matches the profile of the fiber mode(s). Efficient use of light for communications requires that the light have high temporal coherence. Efficient coupling of light to monomode guides requires spatial coherence. Spatial coherence requires the laser to operate in a single lateral and transverse mode. Temporal coherence requires the laser to operate in a single longitudinal mode and implies a very narrow bandwidth, or range of wavelengths.

The most coherent semiconductor lasers use resonators based on grating feedback rather than Fabry-Perot resonators with reflective end facets. Distributed feedback (DFB) lasers use a Bragg reflective grating covering the entire pumped length of the laser. An alternative to DFB lasers is the use of distributed Bragg reflectors (DBRs) located outside the pumped region.

In conventional DFB and DBR lasers, light is removed through an end facet and the output beams have dimensions entirely controlled by the vertical (i.e., normal to the surface) (x) and lateral (y) size and the composition of the guiding structure. Such output beams are typically have too great a divergence for effective coupling to optical fibers, or for other applications requiring beams with low divergence angles.

Beam dimensions (in at least one direction) larger than that available from laser facets may be obtained by using a Bragg grating to couple light out of the waveguide normal (or at certain fixed angles) to the waveguide surface. So called second order Bragg gratings have a period equal to the wavelength of light of the guided mode. The second grating order of such a grating reflects some of the light back in the waveguide plane while the first order couples some of the light normal to the plane. So called first order (Bragg) gratings have a period equal to one half the wavelength of light in the guided mode, reflect light in the waveguide plane, and do not couple light out of the waveguide. First, second, and third order (etc.) gratings are sometimes referred to as being in resonance. A non-resonant grating couples light out of the waveguide at an angle to the normal and does not reflect any light in the waveguide plane.

U.S. Pat. No. 5,970,081 to Hirayama et al. appears to show a laser with a distributed feedback (DFB) grating of second order or higher that claims to obtain a Gaussian shaped output beam by narrowing the waveguide or using a chirped grating at the outcoupling portion. They do not seem to recognize that by so doing the resonant wavelength of the grating is altered along the length of the narrowing or chirping. This would be expected to result in an output which will fan in angle along the longitudinal direction rather than produce a simple Gaussian intensity variation emitted normal to the plane as claimed. They do not define the beam shape in the lateral direction. In all versions they choose second order outcoupling gratings which, absent a narrowing waveguide or chirp, would emit light perpendicular to the surface of the laser waveguide.

U.S. Pat. No. 4,006,432 to Streifer et al. appears to show a grating out-coupled surface emitting DFB laser. The grating period may be chosen to be either resonant or not.

A paper by Bedford, Luo, and Fallahi titled Bow-Tie Surface-Emitting Lasers (IEEE Photonics Technology Letters, Vol. 12, No. 8, August 2000) appears to show a DBR laser with curved second order grating at the ends to couple light out of the waveguide. The same gratings are used for outcoupling and for reflecting the light within the waveguide. They mention the use of non-resonant gratings in conjunction with reflector gratings if emission at other than the direction normal the waveguide plane is desired. The paper appears to show a flared resonator region which allows symmetric outcoupling from both ends of the laser. This facilitates two outputs that are coherent with one another, with emission in the same direction. Such a device is meant to alleviate the complications of controlling the relative phase between the two emitters.

The Tiberio article (Facetless Bragg reflector surface-emitting AlGaAs/GaAs lasers . . . , J. Vac. Sci. Technol., B9(6), 1991) appears to show a surface emitting laser diode that uses first order reflective gratings and either second order (or non-resonant) gratings for outcoupling. Thus, depending on the chosen grating period, the outcoupled beam can be normal or at an angle to the surface.

U.S. Pat. No. 6,064,783 to Congden appears to show a DBR laser with a grating assisted waveguide coupler that couples light from the laser waveguide to a parallel fiber-like glass waveguide for later coupling to a fiber. Several different lasers are coupled to similar fiber-like glass waveguides in the figures. The fiber axis is parallel to the laser waveguides. This reference mentions that this model is easily attached to a fiber through "butt coupling." The grating acts as a Quasi Phase Matching element to couple the light from the laser waveguide to the fiber-like glass waveguide.

The optical and electronic properties of a semiconductor depend on the crystal structure of the device, which has led to investigative work into fabricating artificial structures or superlattices. By tailoring the crystal structure of a device during its fabrication, the optical and electronic properties can be controlled. The crystal structures of such devices may be controlled, for instance, by molecular beam epitaxy (MBE) and metal-organic chemical vapor deposition (MOCVD). Such techniques are capable of monolayer control (~5 angstrom) over the chemical composition of a crystal.

Other commonly used heterostructures are quantum wells, in which a single layer of one semiconductor is sandwiched between two layers of a larger bandgap material. Strain is produced by using an epitaxial layer with a different lattice constant than the substrate. This strain has a dramatic effect on the properties of the optical system. Among other things, it can allow bandgap tunability, reduced threshold current, and improved laser reliability.

Strain can also allow laser emission to have tailored polarization. By using appropriate strain, one can produce light predominantly polarized as TE, or TM.

SUMMARY OF THE INVENTION

The present invention is directed to a chip-scale wavelength division multiplexed (CS WDM) system using grating outcoupled surface emitting lasers. Though the present invention can be embodied in many ways, an example preferred embodiment is summarized here.

In one preferred embodiment the innovative system comprises four semiconductor lasers that share a single outcoupling aperture. First and second lasers share an axis, and their respective cavities overlap at the outcoupling aperture. Third and fourth lasers share an axis, and their respective cavities overlap at the outcoupling aperture. First, second, third, and fourth lasers each resonate at different wavelengths. Four pairs of distributed Bragg reflector gratings are preferably positioned one on either side of the outcoupling grating, with each pair being transmissive of a first wavelength and reflective of a second wavelength.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1A:
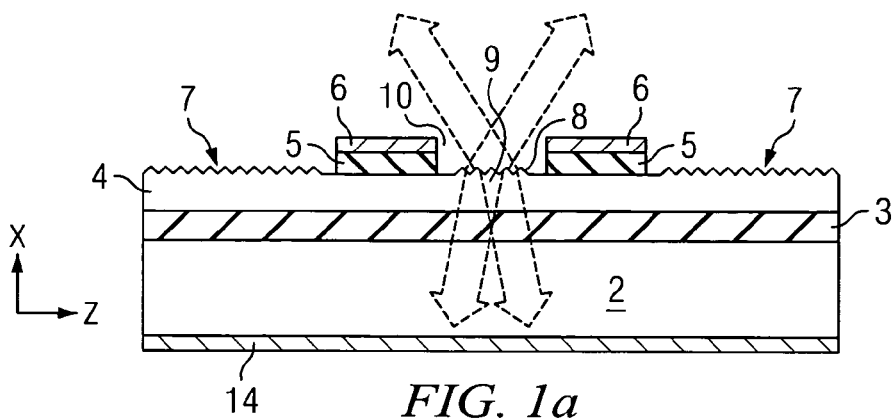
FIG. 1a shows side view of an innovative DBR laser.

The numerous innovative teachings of the present application will be described with particular reference to the presently preferred embodiment (by way of example, and not of limitation).

First order outcoupling gratings and second order or higher outcoupling gratings are both used in at least some embodiments of the present innovations. In the present application, first order DBR refers to a distributed Bragg reflector grating that reflects light within the waveguide in first order for feedback. A second order DBR grating will outcouple light in first order, and feedback light in second order.

In several variations in this application, second order feedback gratings (which couple light out in first order) are used. In such arrangements, the feedback grating depth or strength is varied in the y and z directions so that both the loss and the feedback from the grating help to stabilize the laser mode. For example, the first order lateral mode will be stabilized if the grating strength is varied so that the feedback varies like a Gaussian. This is accomplished by forming the grating so that its strength varies as $$1-\exp(-(y/\omega)^2)$$

where y is the direction parallel with the feedback grating surface and perpendicular to the cavity length, with the origin taken to be at the center of the out-coupling grating, and omega is half the y grating dimension.

First order outcoupling gratings are gratings which couple light out of the waveguide plane in first order but may or may not satisfy the in-plane Bragg condition for second or higher order Bragg reflection. Such gratings may be designed to create no second or higher order reflections which feedback into the laser mode. In these variations which use such out-coupling gratings with no in-plane feedback, the gratings cause no destabilizing feedback into the laser mode and are mechanically and electrically isolated from the structure used to form and pump the resonant laser cavity. Thus, the length and position of the output grating can be chosen to suit the needs of the application for which the laser is designed. The grating periods required for outcoupling, with and without in-plane reflections, are summarized in "Surface Emitting Semiconductor Lasers and Arrays," G. A. Evans and J. M. Hammer, Eds., Academic Press, 1993, which is hereby incorporated by reference.

In general, second and higher order feedback gratings can result in some outcoupling. However, these are less preferred in the context of the present application since such higher order interactions are less efficient.

The outcoupling angle of the gratings in the innovative systems herein disclosed is measured as an angle from the normal to the surface of the outcoupling grating. Resonant outcoupling occurs when the outcoupling grating has a period that is equal to an integer number of wavelengths of the light in the cavity. A grating with period equal to the wavelength of light in the laser cavity will outcouple some light normal to the laser plane and reflect some light in-plane in second order. This means the light exits the grating parallel or nearly parallel to the normal. Outcoupling of light off the normal occurs when the grating is not an integer number of guide wavelengths, and in such a case the light exits the grating at an angle from the normal. This angle depends on the difference between the guide wavelength and the grating period. Varying the wavelength of light or the outcoupling grating period can therefore have great effect on the angle of outcoupled light. The out-coupling grating length, longitudinal position, and the output angles may therefore be chosen over a large range of values. The grating may also be shaped to achieve an output beam of a desired cross section. This is valuable for coupling the output light into fibers of different cross sectional size or at different angles than exactly or nearly normal. All of these "off normal" parameters may be varied without fear of significant mode destabilization or disruption of laser coherence. In the case of exactly or near normal outcoupling, there can be significant in-plane reflection that may (or may not) adversely affect the performance of the laser.

FIG. 1a shows a cross sectional view of a preferred embodiment, taken to show the x-z plane. It should be understood that the features in the several figures may not be to exact scale because of the large differences in dimension between the various structures illustrated.

Layers 3, 4, 5, and 6 are grown on a substrate 2 by known means. Each of these layers may comprise a number of sub-layers. Beneath the substrate is the n contact layer 14. The substrate may comprise a thick layer of n-type semiconductor with a top layer of similar n-type material interposed beneath layer 3. This is frequently called the n-cladding or n-clad. The n-clad will have a refractive index below that of layer 3. Layer 3 is the active and guiding layer usually containing the junction between p- and n-type semiconductor materials. It may comprise, for example, a sequence of one or more barrier layers alternating with quantum well layers. Layer 4 is a p-type clad layer and has lower refractive index than layer 3. Layer 5 may be a multi-layer including a p-clad material chosen to enable good contact to 6 which is the p-metallic contact. Layer 14 provides the other electrical contact for the laser. There are many sequences of possible layers for semiconductor lasers and amplifiers, and the present innovations are not limited to the structures recited here. For example, a structure with a p-type rather than an n-type substrate (and all the necessary alterations to accommodate a change from p- to n-type materials and vice versa) is within the contemplation of the present application.

Gratings 7 are surface relief DBR gratings chosen to reflect light in the +/−z direction to form the laser cavity. (Note that these gratings can be buried structures within the device, and the term "surface relief" does not require the grating be on the surface of the device after processing.) The laser mode will be a standing wave which may be considered to be formed by two waves one flowing in the +z direction, the other in the −z direction. First order DBR gratings are preferred, but second or higher order gratings are also possible. The DBR grating depth and length and the thickness of layer 4 are chosen to provide the desired feedback as known in the art.

The reflector gratings can be given added functionality by varying their grating strength or amplitude in both the y (lateral) direction and the z (cavity) direction. Variation of the grating strength in the lateral direction will impart to the cavity mode light a Gaussian shape, allowing for more of the optical energy of the emitted light to be coupled into a circular mode, such as a fiber. Variation of the grating strength in the z direction can improve the suppression of unwanted longitudinal modes on either side of the desired longitudinal mode the degree to which the unwanted modes are suppressed is called the side-mode suppression ratio.

The outcoupling grating 8 (sometimes referred to herein as OC grating, or OCG) is a surface relief grating with period chosen to couple light at desired angles from the grating plane. It is located at an aperture on the surface of the device. In a preferred embodiment, the outcoupling gratings are about 10 microns wide. The outcoupling grating may be shaped to control the shape of the emitted beam. The grating depth and thickness of the p-clad layer 9 in the vicinity of the grating 8 are chosen to provide the desired degree of outcoupling and to control beam shape. A window or aperture 10 in layers 5 and 6 is provided to allow unobstructed emission of light, and the size and shape of the outcoupling grating is matched to the mode of the fiber to which it couples light (in one embodiment). Because of the two standing waves in the cavity and reflection from the grating, the outcoupling grating simultaneously emits four different light beams, two above and two below the grating plane. These are depicted by dashed arrows. In the case of normal outcoupling of the laser light, the two top lobes are combined into a single beam, as are the two bottom lobes of emitted light.

In one embodiment, the outcoupled light is emitted normal to the surface, since one primary goal is to couple this light into a fiber. When light is emitted normal to the surface, the two top emitted beams are combined into a single beam, and likewise with the downward emitted beams.

Off normal emissions and slightly off normal emissions are also very useful. For example, changing the angle of entry to a fiber by several degrees has minimal impact on the coupling efficiency yet allows the use of an off resonance grating which minimizes undesired feedback into the laser. A larger angle might be desirable to send light to another detector to monitor the laser.

Figure 1B:
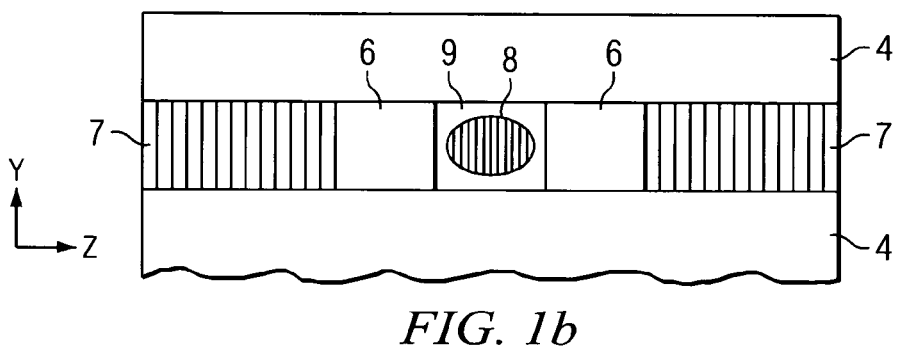
FIG. 1b shows a top view of an innovative DBR laser.

FIG. 1b shows a top view of a single grating outcoupled DBR laser. The outcoupling grating 8 is located at an outcoupling aperture within the envelop of the gain region. On either end of the laser are located distributed Bragg reflectors 7 for providing feedback into the cavity. Of course, cleaved facets may also be used instead of reflector gratings, with highly reflective coatings applied to reflect the light, as shown in later embodiments. With either DBR reflectors or coated facets, the reflectivity of one or both ends can be varied to allow light to escape the cavity for other purposes.

Another embodiment will be discussed with reference to FIGS. 2a and 2b. In this variation, crossed out-coupling gratings are located within the cavities of two (or more) semiconductor lasers arranged at angles to one another and located on a common substrate. In one embodiment, two lasers are used and are positioned at 90 degrees from one another, but more lasers are of course possible—see FIG. 8a for example. The shape and strength of the two gratings are chosen to produce desirable properties in the out-coupled light. Their periods are individually chosen to suit the desired application, such as to control outcoupling angle, or to couple out different wavelengths.

Figure 2A:
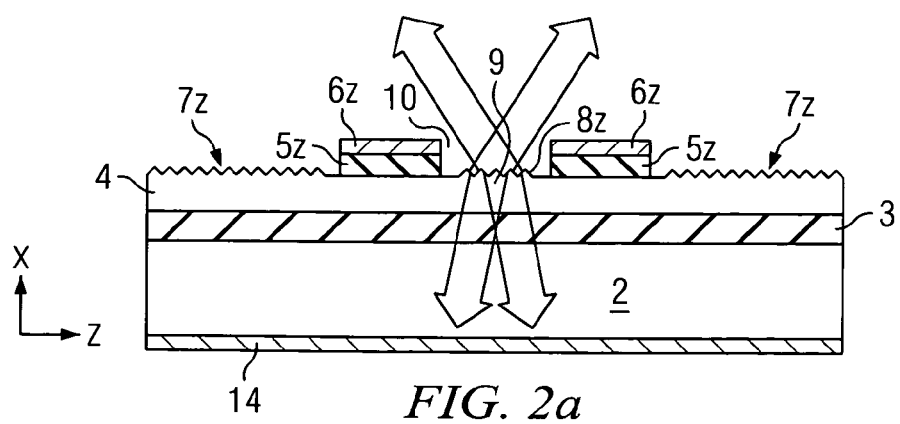
FIG. 2a shows a side view of crossed DBR lasers.

FIG. 2a shows a side view of the crossed grating outcoupled DBR lasers. The structure when seen from the side is similar to that of FIG. 1. Elements that are unique to the laser running in the z-direction are labeled with a z suffix, and elements unique to the laser running in the y-direction are labeled with a y suffix.

Figure 2B:
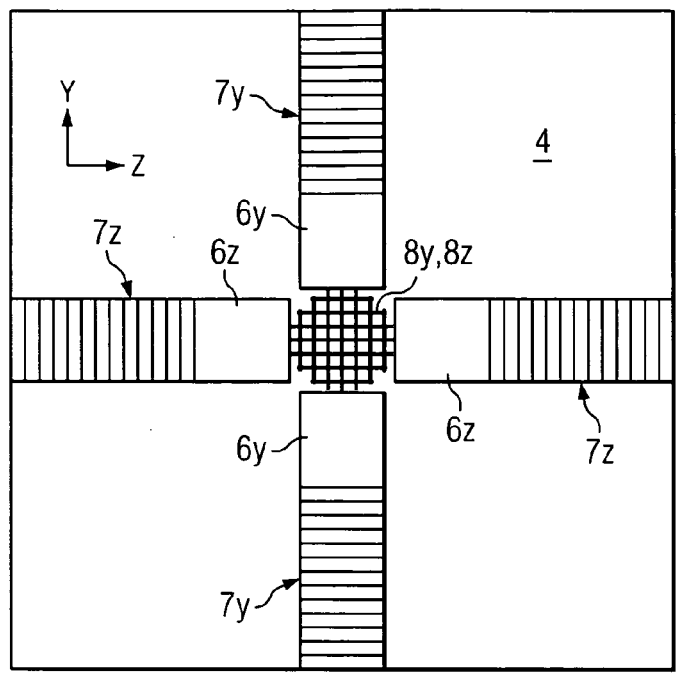
FIG. 2b shows a top view of crossed DBR lasers.

Referring to FIG. 2b, a top view, two crossed DBR lasers are at 90 degrees to one another. Each laser has its own set of reflector gratings 7y, 7z at either end, and both lasers have their own out-coupling grating 8y, 8z positioned at a common location between the reflector gratings. (In the preferred embodiment, the outcoupling aperture is located at the center of the laser, but this is not necessary.) On either side of the out-coupling gratings are the pumped regions of the lasers. (Note that in this variation, the two gain regions of a single laser are discontinuous, having different parts on either side of the outcoupling grating. Other possible embodiments include a single gain region with an outcoupling grating outside the gain region but between the reflector gratings, or even a single continuous gain region that spans the outcoupling grating, having portions on both sides.) The two out-coupling gratings are located at the same place, and the superposition of the two gratings forms a virtual grating with an effective period at an angle of about 45 degrees if the grating periods are about the same for each laser.

The reflector grating periods are chosen to internally reflect the proper wavelength of light. The reflectivity of the DBR is very high at the Bragg condition, and drops off rapidly when the wavelength is different than the Bragg condition wavelength. This allows the wavelength of the output light to be controlled by controlling the period of the DBR gratings.

Referring again to FIG. 2a, in the case of crossed lasers, a cross section taken parallel to the x-y plane would be similar with layers noted with y subscripts in place of z subscripts.

Gratings 8y and 8z are surface relief outcoupling gratings with periods chosen to couple light at desired angles relative to the grating (y-z) plane. As shown in the figure, the gratings can be shaped to control the profile of the outcoupled beam. A circular profile for the grating is indicated (a more complicated profile would be optimal for fiber coupling), but any other useful shape can be produced, depending on the application. The grating depth along with the thicknesses and compositions of the epitaxial structure of the laser are chosen to provide the desired degree of outcoupling.

For each laser, four beams are emitted because of the left and right running waves that form the standing wave mode of the laser (unless the light is outcoupled perpendicular to the device). Two beams symmetrically angled around the normal will emerge above the grating plane and pass through the window 10. Similarly, two beams will be directed towards the substrate below. (Note the epi layers are transparent and this transparency can be made use of to couple light out through the bottom of the device. In such a case, a reflector is placed on the top of the device to direct the top emitted light back into the laser or out the bottom.) In some designs, the grating may be blazed to allow light to be outcoupled to the right or left of normal as well.

When two or more lasers are combined in this way, the crossed outcoupling gratings each polarize the light which they outcouple. In the case of two crossed gratings at 90 degrees, the two beams of light will be polarized at 90 degrees with respect to one another. Coupling light into a fiber with two orthogonal polarizations is required for pumping Raman amplifiers.

Figure 2C:
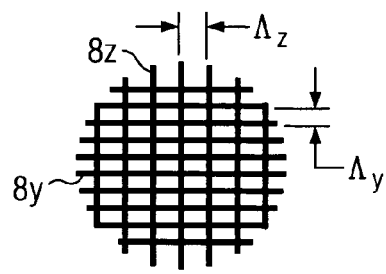
FIG. 2c shows a close up of crossed outcoupling gratings.

FIG. 2c shows a close up of the outcoupling gratings of FIGS. 2a and 2b. The periods, Ly and Lz, of the superimposed two gratings need not be identical. The OCG periods will depend both on the wavelength of light in the cavity (which in turn depends on the periods of the DBR gratings at either end of the cavity) and on the desired outcoupling angle for the emitted beam. By choosing the two gratings to have different OC angles, spatial separation is possible, as may be desired by particular applications. In still another embodiment, the laser light from the devices is emitted normal to the surface, so that both wavelengths of light can be coupled into a fiber through the same aperture or location on the device.

By choosing a non-resonant spacing for the outcoupling grating period (i.e., a distance between grating lines that is not an integer multiple of the wavelength of light within the cavity) the output beams are emitted non-normal to the surface. This is useful in applications where, for example, the fiber into which the light is to be coupled is at an angle relative to the out-coupling grating.

The choice of normal or off normal outcoupling angles can have other advantages. For example, when two or more different wavelengths of light are coupled out of the OC gratings, all wavelengths can be coupled into the same fiber or separated as desired by varying the output angles of the individual gratings. For example, the individual outcoupling gratings for two crossed devices could each couple different wavelengths of light out normal to the surface to couple two different wavelengths into a single fiber mode. This is particularly applicable in the crossed grating out-coupled lasers, discussed further below. If, for some reason, only one wavelength is needed in the fiber, the light from the other device can be emitted off normal so as to not couple into the fiber. The non fiber coupled light could be deflected to a detector, for example. Regardless of the particular use, the choice of outcoupling angles is an advantage to a laser device, and the present application shows how different wavelengths from different sources can be selectively combined into a single region for coupling, or separated into different regions.

The shape and strength (i.e., the depth) of the OC gratings are chosen to produce desirable properties in the out-coupled light. The periods of all OC gratings can be individually chosen according to the needs of that particular laser and the application. For example, the two crossed OC gratings of FIG. 2b can be chosen to outcouple different wavelengths of light, allowing the two lasers of the crossed laser configuration to have different wavelengths, one in the z-direction, another in the y-direction. This of course extrapolates to higher numbers of lasers. Additionally, the two outcoupling gratings (and the different laser diodes themselves) can be chosen to emit the same wavelengths (for example, by making their feedback grating periods the same) allowing additional power and polarization variety in the outcoupled beam(s).

The basic idea can be extended to include a multiplicity of lasers radially arranged around a set of gratings oriented to outcouple light independently for each laser. This allows many wavelengths of light to be generated by merely choosing a different period for the pair of DBRs for each individual laser. The OC gratings can couple this light into a single spatial region (for example, to couple several wavelengths of light into a fiber for DWDM applications), or it can couple the different wavelengths out of the devices at different angles.

Referring still to FIG. 2b, which shows crossed lasers according to a preferred embodiment, if the Bragg reflector gratings are chosen to have the same period in both the y-direction laser and the z-direction laser so that both lasers operate at the same wavelength, and if the crossed OC grating period Lz is the same as Ly, the superposition of the two gratings at right angles results in a virtual grating with an effective period angle of about 45 degrees (if both grating periods are the same). In this case the possible coupling between the y and z lasers can be avoided if the gain regions use quantum wells with compressive strain and thus favor TE mode operation. The virtual grating at 45 degrees will not efficiently reflect TE modes and therefore will not couple the y and z lasers. On the other hand, the use of tensile strain in the quantum well favors TM modes, and may result in enough coupling to either lock the y and z lasers together into a single coherent source, or provide significant crosstalk and other interactions between the two lasers. Thus, the disclosed approach can choose the nature of the output beams to be either a combined single frequency coherent source, or two output beams with two independent wavelengths, or two beams with independent wavelengths but with a controlled amount of crosstalk between them.

The reflector grating periods for the pair of lasers can be the same, which provides additional power and polarization variety. Alternatively, the grating periods can be different, resulting in two different wavelengths of light being outcoupled. This latter configuration can couple light of different wavelengths out at the same angle for coupling light of different wavelengths into the same fiber, saving the cost of implementing a combiner for this function. For example, if the two lasers have different feedback grating periods, they will each generate a different wavelength of light. But both lasers can emit their light normal to the surface of their respective outcoupling grating by choosing each individual outcoupling grating to couple the necessary wavelength of light out normal to the surface.

The size of the grating output aperture can be adjusted for optimum coupling to single or to multi-mode fiber. Likewise, the efficiency of the output element (be it a grating or other element, such as a beam splitter or holographic optical element) can be adjusted by adding a layer of dielectric material to the outcoupling region. If outcoupling efficiency is too high, a high threshold current is required to lase because of the quantity of photons escaping the cavity. With a reflective layer atop the outcoupling grating, some of the light is reflected and continues to oscillate within the cavity. This has the effect of marginally decreasing the required current for lasing. Adding a dielectric layer (for example, nitride, or a dielectric stack, or even a reflective metallic layer) to the outcoupling location therefore controls outcoupling loss and decreases the required threshold current.

In any configuration of the present application where one or more gratings are located and superimposed on one another, the separate gratings can be individually formed by conventional means (including multiple exposures and etches to form the pattern) or can be merged into a single element using a holographic optical element (HOE). The optical requirements of the gratings can be calculated, and a HOE can be designed that accomplishes these required optical functions. Once designed, such a HOE can be patterned for lithography, and can therefore be fabricated in fewer process steps than it would take to create the multiple gratings separately. For example, multiple divergent beams can be captured and coupled into a single fiber with HOEs.

Figure 3:
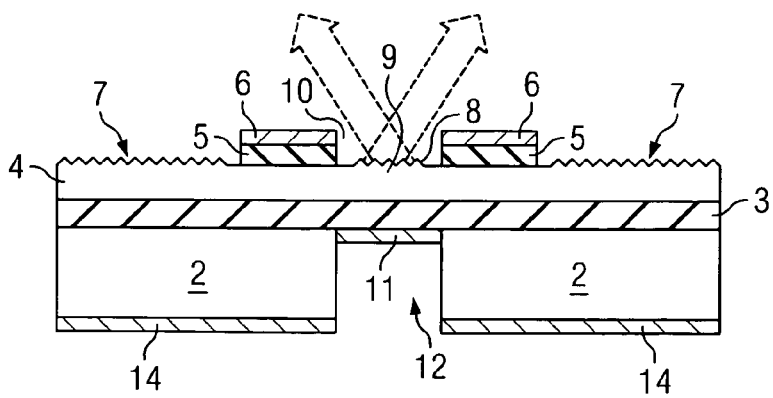
FIG. 3 shows a side view of a DBR laser with a reflective undercoating to reflect laser light.

In another embodiment, shown in FIG. 3, a reflecting surface is placed beneath the outcoupling gratings. This surface 11 reflects the two lower lobes of emitted light. This reflective layer can be made from a metallic substance or other material reflective to the necessary wavelengths of light, or it might be a reflective grating formed in the device, for example. By coupling the lower lobes back up and out of the OC grating, greater power is coupled out of the laser and may be captured by a fiber or other device, such as a detector to monitor the light produced by the device. A space 12 is shown in the substrate of the figure, but the same reflective surface can be placed with the substrate intact.

Figure 4A:
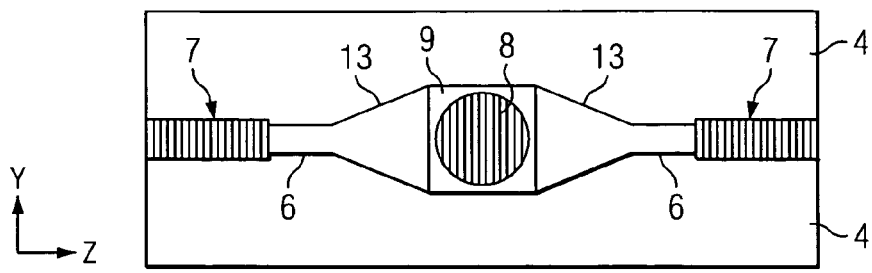
FIG. 4a shows a top view of a DBR with flared or tapering gain regions.

Another embodiment is shown in FIG. 4a, which shows a method to increase the lateral width of the gain regions at the outcoupling grating while maintaining a single-transverse mode. This is accomplished by using a single mode waveguide in the gain region that connects to a tapered gain region. The taper angle is related to the divergence of the fundamental mode of the single mode waveguide. In the preferred embodiment, the tapered regions have a laterally varying current contact, such as a gaussian contact to stabilize the modes in the tapered device.

The embodiment shown in FIG. 4a has a tapered gain region 13. The gain region in this sample has a straight portion as well. Different contacts are used in the preferred embodiment, pumping the different regions with increasing current as necessary. The tapered gain region ensures a wide-spatially-coherent mode, and avoids the restriction on the lateral (y) dimension imposed by the requirement of single lateral mode operation. A wide lateral mode allows the width of the output beam to be set by the width of the grating. The grating area can take a desired shape to match the needs of various applications. For example, circular, elliptical, or Gaussian beams can be produced.

Figure 4B:
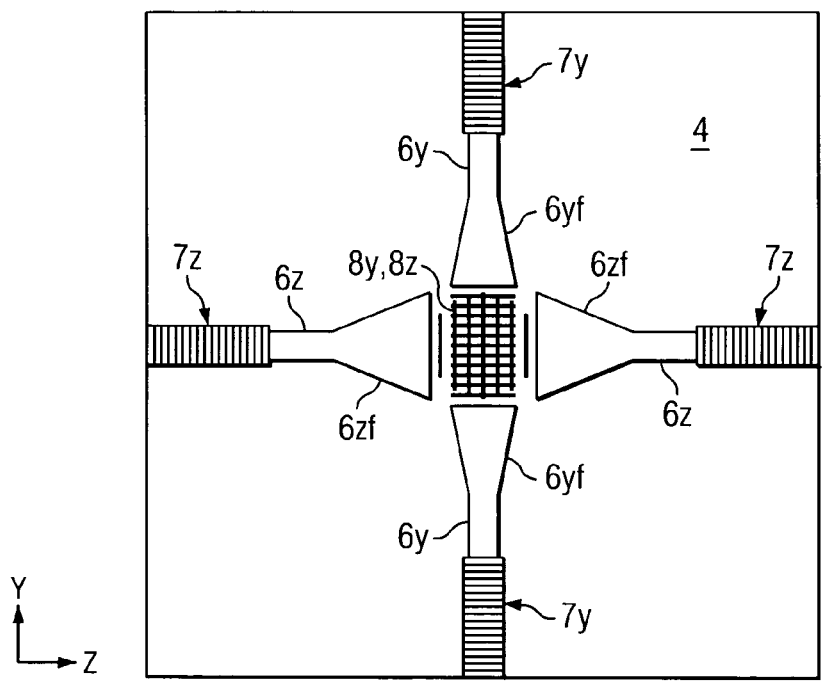
FIG. 4b shows a top view of crossed DBRs each with flared or tapered gain regions.

FIG. 4b shows the tapered gain regions used with multiple crossed grating outcoupled lasers. This embodiment shows two crossed GO (grating outcoupled) lasers at 90 degrees to one another. DBR gratings $7y$, $7z$, create the cavity as in other embodiments discussed above. The pumped regions of the lasers in this variation have a flared section (labeled with the f suffix), being wider closer to the OC gratings. In this example, one laser has an outcoupling grating that is circular in shape, while the other laser has an outcoupling grating that is rectangular. Using a tapered gain region, outcoupled beams of a greater range of sizes can be produced, as the gain region can be made to whatever width is necessary to accommodate (or fully take advantage of) the size of the OC grating. Tapered gain regions also increase the total amount of emitted power from the device.

Figure 5A:
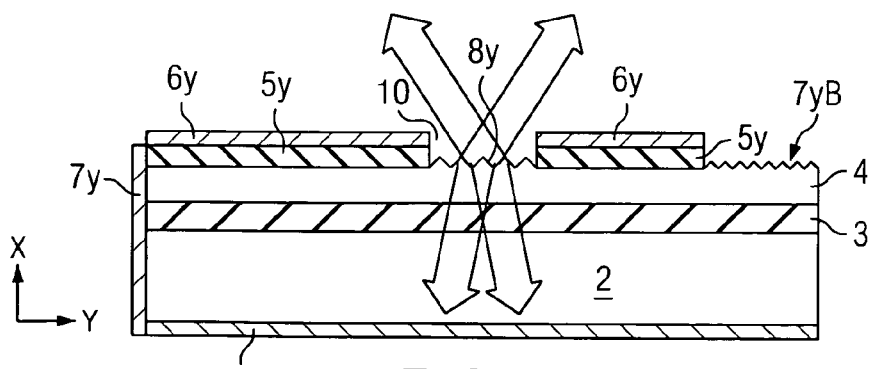
FIG. 5a shows a side view of a laser diode having a DBR at one end and a cleaved facet at the other end.

Another embodiment is shown in FIG. 5a. At one end of the laser, the DBR has been replaced by a reflective end facet $7y$. There are still two gain region portions, separated by the OC grating in this embodiment. The other end of the laser has a DBR $7y$B, the period of which determines the wavelength that will be stable in the cavity.

Figure 5B:
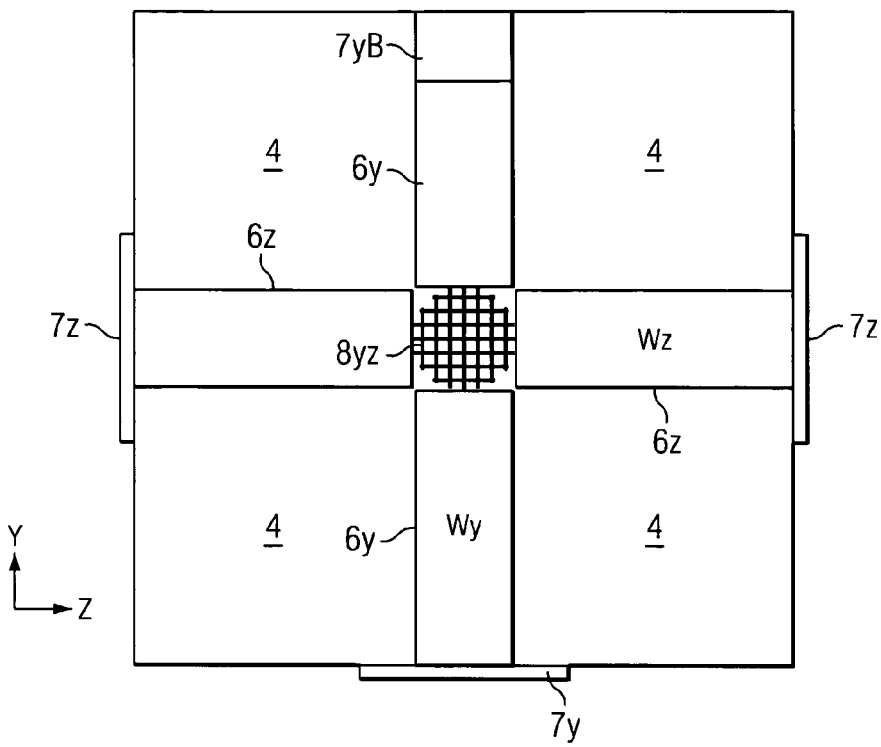
FIG. 5b shows a top view of crossed lasers, using both DBRs and reflecting facets.

A top view of a crossed GO laser system is shown in FIG. 5b. In this variation, the laser running in the z-direction (horizontal in the figure) has reflective end facets on both ends, and no DBRs for reflecting the light in the cavity. The y-direction laser (vertical in the figure) has a DBR at one end, and a reflective facet at the other end. Cleaved facet ends reduce the length of the device since the length of the DBR sections is omitted.

Figure 5C:
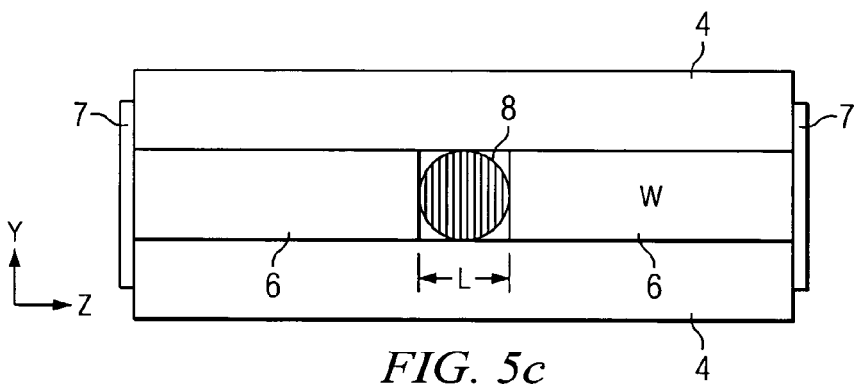
FIG. 5c shows a top view of a laser diode using cleaved facets.

FIG. 5c shows a top view of a laser diode with cleaved facets at both ends. The length of the gain region is fixed by the reflectivity of the end facets or the DBRs.

Figure 6:
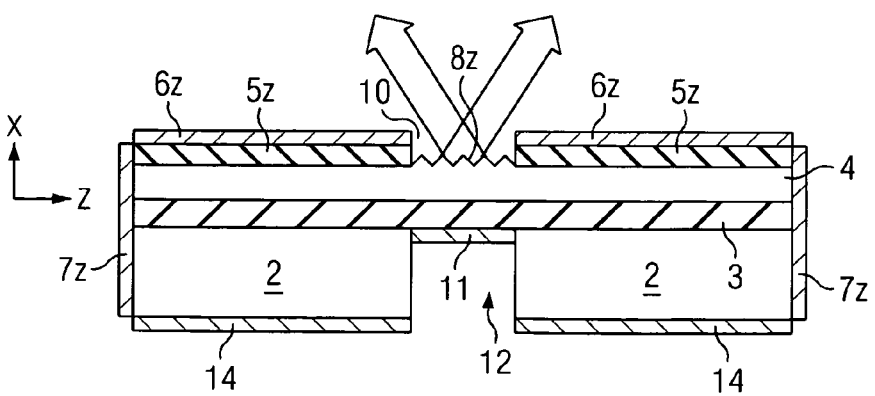
FIG. 6 shows a laser diode using cleaved facets and a reflective layer beneath part of the waveguide.

FIG. 6 shows a laser with two reflective end facets and an OC grating between the pumped regions. Beneath the OC grating is a reflector for reflecting the two downward directed beams back up toward the surface of the laser. Capturing the downward beams is useful to increase efficiency.

Figure 7:
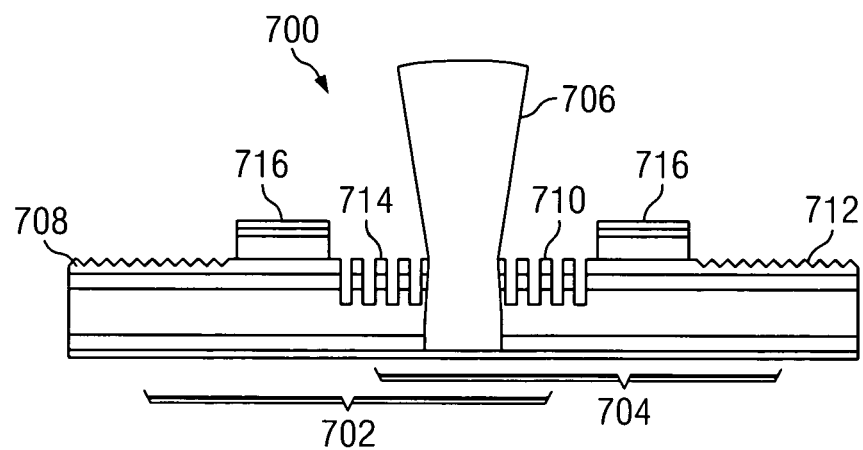
FIG. 7 shows a side view of a preferred embodiment in which a pair of lasers share an outcoupling aperture.

FIG. 7 shows a side view of a preferred embodiment. In this example, two lasers are shown sharing the same outcoupling aperture in a linear configuration. The system 700 includes a first cavity 702 and a second cavity 704. In a preferred embodiment, first cavity 702 resonates at a different wavelength than second cavity 704. First cavity 702 preferably has a grating reflector 708 at a first end and a grating reflector 710 at a second end. Second cavity 704 preferably has a grating reflector 712 at a first end and a grating reflector 714 at a second end. Gratings 708 and 710 are designed to reflect light of a first wavelength, while gratings 712 and 714 are designed to reflect light of a second wavelength. Grating 710 is preferably 100% reflective at the wavelength of grating 708 and zero percent reflective at the wavelength of grating 712. Likewise, grating 714 is preferably 100% reflective at the wavelength of grating 712 and preferably zero percent reflective at the wavelength of grating 708. Thus, the first cavity 702 comprises gratings 708 and 710, while second cavity 704 comprises gratings 712 and 714. Light resonating in first cavity 702 is not reflected by grating 714, while light in second cavity 704 is not reflected by grating 710. Note that both cavities share the outcoupling aperture 706.

The period of the shared outcoupler is determined in most instances by the average of the period required for each wavelength. If the outcoupler period is slightly off the exact period required for normal emission, the resulting far-field of each laser is potentially broadened.

The system also preferably includes contacts 716 for injecting current into the laser system. Since both cavities couple light from the same aperture, this system is capable of producing at least two distinct wavelengths that can be independently modulated.

Though the above description states that 100% and zero percent reflectivities are desired, those of ordinary skill in the art will appreciate that these numbers are estimates or goals, and that realistic limitations apply to the transmission or reflectivity but are consistent with the present innovations.

Figure 8:
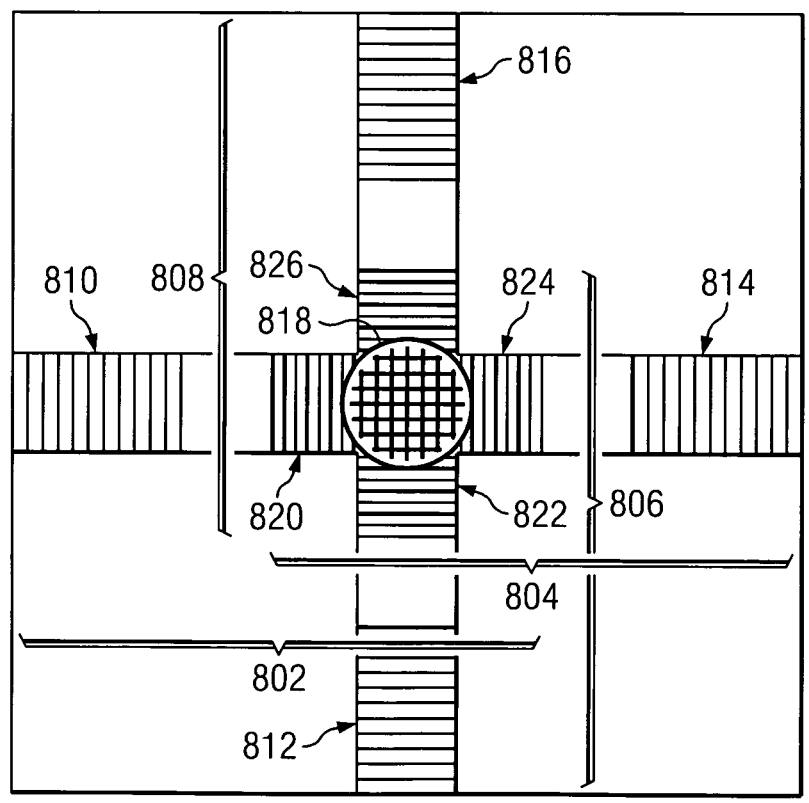
FIG. 8 shows a top view of a preferred embodiment in which four lasers share an outcoupling aperture.

FIG. 8 shows a system 800 with first cavity 802, second cavity 804, third cavity 806, and fourth cavity 808. First and second cavities share an axis, as do third and fourth cavities. Each cavity overlaps outcoupling aperture 818 though which light is emitted. Cavity 802 includes reflectors 810 and 824 which are reflective at a first wavelength. Cavity 804 includes reflectors 820 and 814 which are reflective at a second wavelength. Cavity 806 includes reflectors 812 and 826 which are reflective at a third wavelength. Cavity 808 includes reflectors 816 and 822 which are reflective at a fourth wavelength. Reflectors 810, 812, 814, and 816 are preferably shallow grating DBRs, while reflectors 820, 822, 824, and 826 are preferably deep grating DBRs. Grating 820 is preferably not reflective at the wavelength of the first cavity 802 and allows the light in that cavity to pass unhindered. Likewise, grating 824 is not reflective at the wavelength of the second cavity 804; grating 822 is not reflective at the wavelength of third cavity 806; and grating 826 is not reflective at the wavelength of fourth cavity 808. All cavities outcouple light from the same aperture 818, which preferably comprises crossed outcoupling gratings. It should be noted that crosstalk is preferably reduced in this example system by the means described with reference to FIG. 2b, above.

The embodiment of FIG. 8 allows fabrication of four cavities which all couple light out of the same outcoupling aperture, each cavity resonating with a different frequency of light. Thus, four independent wavelengths which can each be modulated independent of the others, can be output through the aperture 818.

In the innovative system, if the central emission wavelengths of the different lasers are spread out over a large spectrum with respect to one another, then some mechanism must be employed by which gain is matched to the necessary wavelengths. For example, in one embodiment, the wavelength at which the gain peaks in each cavity is produced to match the resonant wavelength of that cavity. Gain peak can be adjusted, for example, by selective area growth. The position of the gain peak can also be adjusted by intermixing of the quantum wells. Hence, each cavity of the laser system has a different gain, matching the emission wavelength of that cavity. In another embodiment, a broad gain spectrum is provided for all the cavity wavelengths. This can be achieved using either multiple quantum wells each with varying thicknesses, or by using a quantum dot active layer with dots of varying size.

The following background publications provide additional detail regarding possible implementations of the disclosed embodiments, and of modifications and variations thereof, and the predictable results of such modifications. All of these publications are hereby incorporated by reference: "Surface Emitting Semiconductor Lasers and Arrays," Ed. Evans and Hammer, Academic Press, 1993; "Research Toward Optical Fiber transmission Systems Part 1," Proc. IEEE, 61, 1703–1751, December 1973; "Optimized Couplers Between Junction lasers and Single Mode Fibers," Hammer, Neil, RCA laboratories, Princeton, N.J., Final Report, 31 Aug. 1981–31 Jan. 1983; "Observations and Theory of High Power Butt Coupling to $LiNbO_3$-type waveguides," Hammer and Neil, IEEE J. Quantum Electronics, QE-18, 1751–1758, October 1982; "Laser Diode End Fire Coupling into $Ti:LiNbO_3$ waveguides," Appl, Optics, 18, 2536–2537, August 1979; "16-ch Arrayed Waveguide Grating Module with 100-GHz Spacing," Tsunetoshi et al., Furukawa Review, No. 19, 2000; "Fabrication of InP-Based Reflection Type Arrayed Waveguide Grating with Metal Coated Reflection Facet," Kim et al., Jpn, J. Appl. Phys. Vol. 40 (2001) pp. L36–37; Part 2, No. IA/B, The Japan Society of Applied Physics, 15, Jan., 2001; "All-optical networks may one day form national backbone," Ramaswami et al., OE Reports Number 188, August 1999; "Crosstalk Reduction of Arrayed Waveguide Gratings by UV trimming of individual waveguides without $H_2$-Loading," Gehler et al., Furukawa Review, No. 22, 2002; C. Dragone, "An NXN Optical Multiplexer Using a Planar Arrangement of Two Star Couplers," IEEE Photonics Technology Letters, Vol. 3, No. 9, September 1991, pp. 812–815. M. K. Smit and C van Dam, "PHASAR-Based WEM-Devices: Principles, Design and Applications," IEEE Journal of Selected Topics in Quantum Electronics, Vol. 2, No. 2, June 1996, pp. 236–250; L. B. Soldano, F. B. Veerman, M. K. Smit, B. H. Verbeek, A. H. Dubost and E. C. M., Pennings, "Planar Monomode Optical Couplers Based on Mulitmode Interference Effects," Journal of Lightwave Technology, December 1992, pp. 1843–1850; H. M. Stoll, "Distributed Bragg Deflector: A Multifunction Integrated Optical Device," Applied Optics, Vol. 17, No. 16, pp. 2562–2569, 15 Aug., 1978; "Strained Quantum Wells for Polarization-Independent Electrooptic Waveguide Switches" by Zucker et al, Journal of Lightwave Technology, Bd. 10, Nr. 12, 1 Dec. 1992, pp. 1926–1930. "High-speed MQW electroabsorption optical modulators integrated with low-loss waveguides" by Ido et al, IEEE Photonics Technology Letters, Bd. 7, Nr. 2, 1 Feb. 1995, pp. 170–172. Wavelength converter based on integrated all-active three-port Mach-Zehnder interferometer by M. Schilling et al, EL Lett. Vole 30, No. 25, 1994, pp. 2128–2130. New Photonic Device Integration by Selective-Area Movpe and Its Application to Optical Mod/Laser Integration (Invited Paper) by Suzuki, et al, Micro.Tec. Ltrs, vol. 7, No. 3, February. 1994. "Novel Growth Techniques for the Fabrication of Photonic Integrated Circuits" by Coudenys et al, Mat. Res. Symp. Proc. vol. 240, 1992, pp. 15–16; and the following U.S. patents: U.S. Pat. Nos. 4,511,408, 6,489,041, 6,507,042, 4,591,889, and 5,757,833, all of which are hereby incorporated by reference.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A surface emitting semiconductor laser system, comprising:
    a first cavity having a first reflector at a first end and a second reflector at a second end;
    a second cavity having a third reflector at a first end and a fourth reflector at a second end;
    a third cavity having a fifth reflector at a first end and a sixth reflector at a second end;
    a fourth cavity having a seventh reflector at a first end and an eighth reflector at a second end;
    wherein the second reflector is reflective of a first wavelength of light but transmissive of a second wavelength of light;
    wherein the fourth reflector is reflective of the second wavelength but transmissive of the first wavelength;
    wherein the sixth reflector is reflective of a third wavelength of light but transmissive of a fourth wavelength of light;
    wherein the eighth reflector is reflective of the fourth wavelength but transmissive of light the third wavelength.

2. The system of claim 1, wherein the first, second, third, and fourth cavities all overlap an outcoupling aperture.

3. The system of claim 1, wherein each cavity resonates at a different wavelength.

4. The system of claim 1, wherein the first, third, fifth, and seventh reflectors are shallow distributed Bragg reflector gratings.

5. The system of claim 1, wherein the second, fourth, sixth, and eighth reflectors are deep distributed Bragg reflector gratings.

* * * * *